US005789027A

United States Patent [19]

Watkins et al.

[11] Patent Number: 5,789,027

[45] Date of Patent: Aug. 4, 1998

[54] METHOD OF CHEMICALLY DEPOSITING MATERIAL ONTO A SUBSTRATE

[75] Inventors: James J. Watkins; Thomas J. McCarthy, both of Hadley, Mass.

[73] Assignee: University of Massachusetts, Boston, Mass.

[21] Appl. No.: 748,195

[22] Filed: Nov. 12, 1996

[51] Int. Cl.[6] .......... C23C 16/06

[52] U.S. Cl. .......... 427/250; 427/255; 427/255.1; 427/255.2; 427/255.3; 427/299

[58] Field of Search .......... 427/250, 255, 427/255.1, 255.2, 255.3, 299

[56] References Cited

U.S. PATENT DOCUMENTS

| | | | |
|---|---|---|---|
| 4,552,786 | 11/1985 | Berneburg et al. | 427/255.1 |
| 4,582,731 | 4/1986 | Smith | 427/421 |
| 4,734,227 | 3/1988 | Smith | 264/13 |
| 4,737,384 | 4/1988 | Murthy et al. | 427/369 |
| 4,970,093 | 11/1990 | Sievers et al. | 427/377 |
| 5,403,621 | 4/1995 | Jackson et al. | 427/255.1 |

OTHER PUBLICATIONS

Bocquet, et al., "A New $TiO_2$ Film Deposition Process in a Supercritical Fluid," *Surface and Coatings Technology*, 70:73–78 (1994). (no month date).

Hampden–Smith, et al., "Chemical Vapor Deposition of Metals: Part 1. An Overview of CVD Processes," Chem. Vapor Deposition, 8–23 (1995). (no month date).

Hansen, et al., "Supercritical Fluid Transport–Chemical Deposition of Films," *Chem. Mater.* 4:749–752 (1992). (no month date).

Hybertson, et al., "Deposition of Palladium Films By a Novel, Supercritical Fluid Transport–Chemical Deposition Process," *Mat. Res. Bull.*, 26:1127–1133 (1991). (no month date).

Louchev, et al., "The Morphological Stability in Supercritical Fluid Chemical Deposition of Films Near the Critical Point," *Journal of Crystal Growth*, 155:276–285 (1995). (no month date).

Watkins, et al., "Polymer/Metal Nanocomposite Synthesis in Supercritical $CO_2$," Chemistry of Materials, vol. 7, (1995) (no month date).

*Primary Examiner*—Katherine A. Bareford

*Attorney, Agent, or Firm*—Fish & Richardson P.C.

[57] ABSTRACT

Methods are described for depositing a film of material on the surface of a substrate by i) dissolving a precursor of the material into a supercritical or near-supercritical solvent to form a supercritical or near-supercritical solution; ii) exposing the substrate to the solution, under conditions at which the precursor is stable in the solution; and iii) mixing a reaction reagent into the solution under conditions that initiate a chemical reaction involving the precursor, thereby depositing the material onto the solid substrate, while maintaining supercritical or near-supercritical conditions. The invention also includes similar methods for depositing material particles into porous solids, and films of materials on substrates or porous solids having material particles deposited in them.

21 Claims, 2 Drawing Sheets

METHOD OF CHEMICALLY DEPOSITING MATERIAL ONTO A SUBSTRATE

BACKGROUND OF THE INVENTION

The invention relates to a method for depositing a material onto a substrate surface or into a porous solid.

Thin films of materials such as metals, semiconductors, or metal oxide insulators are of great importance in the microelectronics industry. Fabrication of integrated circuits involves formation of high purity thin films, often with multiple layers, on patterned substrates. One of the most common methods for producing thin films is chemical vapor deposition (CVD). In thermal CVD, volatile precursors are vaporized under reduced pressure at temperatures below their thermal decomposition temperature and transported by means of a carrier gas into an evacuated chamber containing a substrate. The substrate is heated to high temperatures, and thermolysis at or adjacent to the heated substrate results in the surface deposition of the desired film. For a general reference on CVD see: Hitchman et al., eds., *Chemical Vapor Deposition Principles and Applications* (Academic Press, London, 1993).

Thin films have also been formed using supercritical fluids. For example, Murthy et al. (U.S. Pat. No. 4,737,384) describes a physical deposition method in which a metal or polymer is dissolved in a solvent under supercritical conditions and as the system is brought to sub-critical conditions the metal or polymer precipitates onto an exposed substrate as a thin film. Sievers et al. (U.S. Pat. No. 4,970,093) describes a standard CVD method in which organometallic CVD precursors are delivered to a conventional CVD reactor by dissolving the precursors in a supercritical fluid solvent. The solvent is expanded to produce a fine precursor aerosol which is injected into the CVD reactor under standard CVD conditions, i.e. pressures less than or equal to 1 atmosphere, to deposit a thin film on a substrate.

Louchev et al. (*J. Crystal Growth*, 155:276–285, 1995) describes the transport of a precursor to a heated substrate (700K) in a supercritical fluid where it undergoes thermolysis to yield a thin metal (copper) film. Though the process takes place under high pressure, the temperature in the vicinity of the substrate is high enough that the density of the supercritical fluid approaches the density of a conventional gas. The film produced by this method had an atomic copper concentration of approximately 80% (i.e. 20% impurities). Bouquet et al. (*Surf. and Coat.* Tech., 70:73–78, 1994) describes a method in which a metal oxide is deposited from a supercritical mixture of liquid and gas co-solvents at a temperature of at least 240° C. The thin film forms as a result of thermolysis at a substrate heated to at least 290° C.

SUMMARY OF THE INVENTION

The invention features a new method for depositing a material onto a substrate surface or into a porous solid. The method is referred to herein as chemical fluid deposition (CFD). CFD involves dissolving a precursor of the material into a solvent under supercritical or near-supercritical conditions and exposing the substrate (or porous solid) to the solution. A reaction reagent is then mixed into the solution and the reaction reagent initiates a chemical reaction involving the precursor, thereby depositing the material onto the substrate surface (or within the porous solid). Use of a supercritical solvent in conjunction with a reaction reagent produces high purity thin films at temperatures that are much lower than conventional CVD temperatures.

In general, in one aspect, the invention features a method for depositing a film of a material, e.g., a metal, mixture of metals, metal oxide, metal sulfide, insulator, or semiconductor, onto the surface of a substrate, e.g., a silicon wafer, by i) dissolving a precursor of the material into a solvent, e.g., carbon dioxide, under supercritical or near-supercritical conditions to form a supercritical or near-supercritical solution; ii) exposing the substrate to the solution under conditions at which the precursor is stable in the solution; and iii) mixing a reaction reagent, e.g., hydrogen, into solution under conditions that initiate a chemical reaction involving the precursor, e.g., a reduction, oxidation, or hydrolysis reaction, thereby depositing the material onto the surface of the substrate, while maintaining supercritical or near-supercritical conditions.

For example, the method can be conducted so that the temperature of the substrate is maintained at no more than 200° C., the solvent has a reduced temperature between 0.8 and 1.6, the solvent has a density of at least 0.2 g/cm$^3$, the solvent has a density of at least one third of its critical density, or so that the solvent has a critical temperature of less than 150° C. In addition, the method can be carried out so that the temperature of the substrate measured in Kelvin is less than twice the critical temperature of the solvent measured in Kelvin, or so that the temperature of the substrate measured in Kelvin divided by the average temperature of the supercritical solution measured in Kelvin is between 0.8 and 1.7. The method can also be conducted such that the average temperature of the supercritical solution is different from the temperature of the substrate.

In another aspect, the invention features a method for depositing material within a microporous or nanoporous solid substrate by dissolving a precursor of the material into a solvent under supercritical or near-supercritical conditions to form a supercritical or near-supercritical solution; ii) exposing the solid substrate to the solution under conditions at which the precursor is stable in the solution; and iii) mixing a reaction reagent into the solution under conditions that initiate a chemical reaction involving the precursor, thereby depositing the material within the solid substrate, while maintaining supercritical or near-supercritical conditions. Again, this method can be conducted such that the temperature of the solid substrate is maintained at no more than 200° C.

In another aspect, the invention features a film of a material, e.g., a metal or semiconductor, on a substrate, the coated substrate itself, and microporous or nanoporous solid substrates having such materials deposited on and within them. These new substrates may be prepared by the new method.

As used herein, a "supercritical solution" (or solvent) is one in which the temperature and pressure of the solution (or solvent) are greater than the respective critical temperature and pressure of the solution (or solvent). A supercritical condition for a particular solution (or solvent) refers to a condition in which the temperature and pressure are both respectively greater than the critical temperature and critical pressure of the particular solution (or solvent).

A "near-supercritical solution" (or solvent) is one in which the reduced temperature (actual temperature measured in Kelvin divided by the critical temperature of the solution (or solvent) measured in Kelvin) and reduced pressure (actual pressure divided by critical pressure of the solution (or solvent)) of the solution (or solvent) are both greater than 0.8 but the solution (or solvent) is not a supercritical solution. A near-supercritical condition for a particular solution (or solvent) refers to a condition in which the reduced temperature and reduced pressure are both respectively greater 0.8 but the condition is not supercritical. Under ambient conditions, the solvent can be a gas or liquid. The term solvent is also meant to include a mixture of two or more different individual solvents.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, the preferred methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The invention includes a number of advantages, including the use of process temperatures that are much lower than conventional CVD temperatures. A reduction in process temperature is advantageous in several respects: it aids in the control of depositions, minimizes residual stress generated by thermal cycling in multi-step device fabrication that can lead to thermal-mechanical failure, minimizes diffusion and reaction of the incipient film with the substrate, renders the deposition process compatible with thermally labile substrates such as polymers, and suppresses thermally-activated side-reactions such as thermal fragmentation of precursor ligands that can lead to film contamination. Thus, the films produced by the process are substantially free of impurities.

An additional advantage of the invention is that it obviates the CVD requirement of precursor volatility since the process is performed in solution. Furthermore, since the process is performed under supercritical or near-supercritical conditions, the diffusivity of precursors dissolved in solution is increased relative to liquid solutions, thereby enhancing transport of precursor and reaction reagent to, and decomposition products away from, the incipient film. The supercritical fluid is also a good solvent for ligand-derived decomposition products, and thus facilitates removal of potential film impurities and increases the rate at which material forms on the substrate in cases where this rate is limited by the desorption of precursor decomposition products. In addition, since the reactants are dissolved into solution, precise control of stoichiometry is possible.

Another advantage of the invention is that the supercritical solution is usually miscible with gas phase reaction reagents such as hydrogen. As a result, gas/liquid mass transfer limitations common to reactions in liquid solvents are eliminated, and so excess quantities of the reaction reagent can easily be used in the reaction forming the material.

Other features and advantages of the invention will be apparent from the following detailed description, and from the claims.

DETAILED DESCRIPTION

Figure 1:
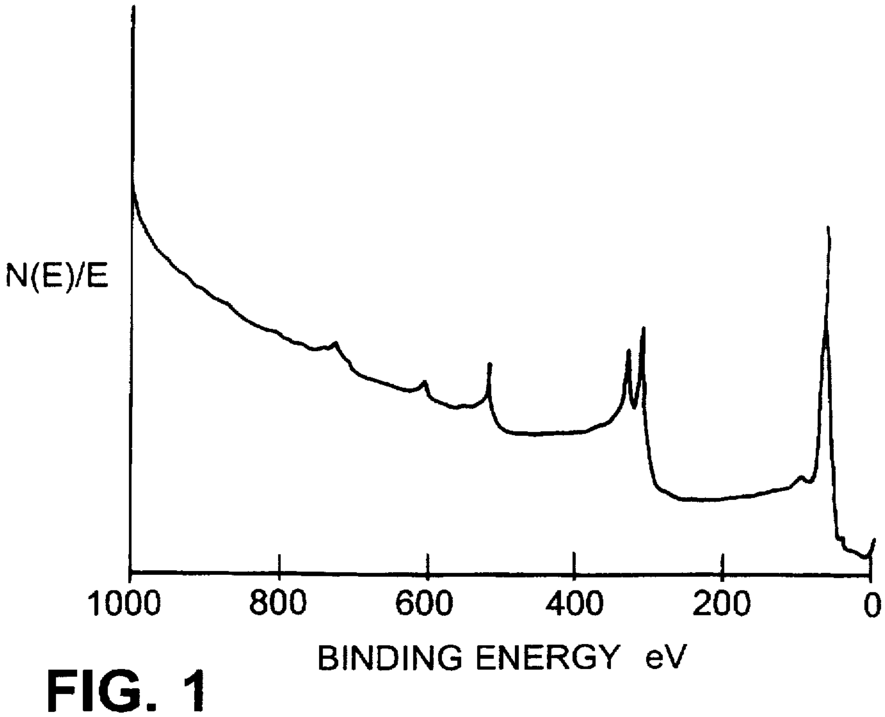
FIG. 1 is an X-ray photoelectron spectroscopy (XPS) survey spectra (75° take-off angle) of a platinum film deposited on a silicon wafer using CFD. Results are shown after sputter cleaning with $Ar^+$ ions to remove atmospheric contamination.

Chemical Fluid Deposition (CFD) is a process by which materials (e.g., metals, metal oxides, or semiconductors) are deposited from a supercritical or near-supercritical solution via chemical reaction of soluble precursors. Desired materials can be deposited on a substrate, such as a silicon wafer, as a high-purity (e.g., better than 99%) thin film (e.g., less than 5 microns). The supercritical fluid transports the precursor to the substrate surface where the reaction takes place and transports ligand-derived decomposition products away from the substrate thereby removing potential film impurities. Typically, the precursor is unreactive by itself and a reaction reagent (e.g., a reducing or oxidizing agent) is mixed into the supercritical solution to initiate the reaction which forms the desired materials. The entire process takes place in solution under supercritical conditions. The process provides high-purity films at various process temperatures under 250° C. (e.g., below 200° C., 150° C., 100° C., 80° C., 60° C., or 40° C.), depending on the precursors, solvents, and process pressure used.

CFD can be used, for example, to deposit platinum (Pt) and palladium (Pd) films onto silicon wafers or fluoropolymer substrates. In these examples, process temperatures of as low as 80° C. provide a film purity that can be better than 99%. A complete description of these examples and others are given below.

CFD can also be used to deposit materials into mesoporous or microporous inorganic solids. Examples include the metallation of nanometer-size pores in catalyst supports such as silicalites and amorphous mesoporous aluminosilicate molecular sieves. Supercritical fluids have gas-like transport properties (e.g., low viscosity and absence of surface tension) that ensure rapid penetration of the pores. Uniform deposition throughout the pores is further facilitated by independent control of the transport (via solution) and deposition (via reaction reagent) mechanisms in CFD. By contrast, metallation of porous substrates by CVD often results in choking of the pores by rapid deposition at the pore mouth resulting from high process temperatures.

General Method

A batch CFD run involves the following general procedure. A single substrate and a known mass of precursor are placed in a reaction vessel (e.g., a stainless steel pipe), which is sealed, purged with solvent, weighed, and immersed in a circulating controlled temperature bath. The vessel is then filled with solvent using a high pressure manifold. The contents of the reactor are mixed using a vortex mixer and conditions are brought to a specified temperature and pressure at which the solvent is a supercritical or near-supercritical solvent. The mass of solvent transferred into the reaction vessel is determined gravimetrically using standard techniques. The vessel is maintained at this condition (at which the precursor is unreactive) for a period of time, e.g., up to one hour or longer, sufficient to ensure that the precursor has completely dissolved and that the reaction vessel is in thermal equilibrium.

A reaction reagent is then transferred through a manifold connected to the reaction vessel. The reaction reagent can be a gas or a liquid, or a gas, liquid, or solid dissolved in a supercritical solvent. The transfer manifold is maintained at a pressure in excess of that of the reaction vessel. The mass of reaction reagent transferred into the reaction vessel is usually in molar excess relative to the precursor. The reaction is typically carried out for at least one hour, though the reaction may be complete at times much less than one hour, e.g., less than 20 minutes or less than 30 seconds. The optimal length of reaction time can be determined empirically. When the reactor has cooled, the substrate is removed and can be analyzed.

A continuous CFD process is similar to the above batch method except that known concentrations of the supercritical (or near-supercritical) solution and reaction reagent are taken from separate reservoirs and continuously added to a reaction vessel containing multiple substrates as supercritical solution containing precursor decomposition products or unused reactants is continuously removed from the reaction vessel. The flow rates into and out of the reaction vessel are made equal so that the pressure within the reaction vessel remains substantially constant. The overall flow rate is optimized according to the particular reaction. Prior to introducing precursor-containing solution into the reaction vessel, the reaction vessel is filled with neat solvent (which is the same as the solvent in the precursor solution) at supercritical or near-supercritical pressures and is heated to supercritical or near-supercritical temperatures. As a result, supercritical or near-supercritical conditions are maintained as the precursor-containing solution is initially added to the reaction vessel.

Solubility of the precursor at the reaction conditions can be verified in a variable volume view cell, which is well known in the art (e.g., McHugh et al, *Supercritical Fluid Extraction: Principles and Practice*; Butterworths: Boston, 1986). Known quantities of precursor and supercritical solvent are loaded into the view cell, where they are heated and compressed to conditions at which a single phase is observed optically. Pressure is then reduced isothermally in small increments until phase separation (either liquid-vapor or solid-vapor) is induced.

The temperature and pressure of the process depend on the reactants and choice of solvent. Generally, temperature is less than 250° C. and often less than 100° C., while the pressure is typically between 50 and 500 bar. A temperature gradient between the substrate and solution can also be used to enhance chemical selectivity.

Solvents

Solvents that can be used as supercritical fluids are well known in the art and are sometimes referred to as dense gases (Sonntag et al., *Introduction to Thermodynamics, Classical and Statistical*, 2nd ed., John Wiley & Sons, 1982, p. 40). At temperatures and pressures above certain values for a particular substance (defined as the critical temperature and critical pressure, respectively), saturated liquid and saturated vapor states are identical and the substance is referred to as a supercritical fluid. Solvents that are supercritical fluids are less viscous than liquid solvents by one to two orders of magnitude. In CFD, the low viscosity of the supercritical solvent facilitates improved transport (relative to liquid solvents) of reagent to, and decomposition products away, from the incipient film. Furthermore, many reagents which would be useful in chemical vapor deposition are insoluble or only slightly soluble in various liquids and gases and thus cannot be used in standard CVD. However, the same reagents often exhibit increased solubility in supercritical solvents. Generally, a supercritical solvent can be composed of a single solvent or a mixture of solvents, including for example a small amount (<5 mol %) of a polar liquid co-solvent such as methanol.

It is important that the reagents are sufficiently soluble in the supercritical solvent to allow homogeneous transport of the reagents. Solubility in a supercritical solvent is generally proportional to the density of the supercritical solvent. Ideal conditions for CFD include a supercritical solvent density of at least 0.2 g/cm$^3$ or a density that is at least one third of the critical density (the density of the fluid at the critical temperature and critical pressure).

The table below lists some examples of solvents along with their respective critical properties. These solvents can be used by themselves or in conjunction with other solvents to form the supercritical solvent in CFD. The table respectively lists the critical temperature, critical pressure, critical volume, molecular weight, and critical density for each of the solvents.

Critical Properties of Selected Solvents

| Solvent | $T_c$ (K) | $P_c$ (atm) | $V_c$ (cm/mol) | Molecular Weight | $\rho_c$ (g/cm$^3$) |
|---|---|---|---|---|---|
| $CO_2$ | 304.2 | 72.8 | 94.0 | 44.01 | 0.47 |
| $C_2H_6$ | 305.4 | 48.2 | 148 | 30.07 | 0.20 |
| $C_3H_8$ | 369.8 | 41.9 | 203 | 44.10 | 0.22 |
| n-$C_4H_{10}$ | 425.2 | 37.5 | 255 | 58.12 | 0.23 |
| n-$C_5H_{12}$ | 469.6 | 33.3 | 304 | 72.15 | 0.24 |
| $CH_3$—O—$CH_3$ | 400 | 53.0 | 178 | 46.07 | 0.26 |
| $CH_3CH_2OH$ | 516.2 | 63.0 | 167 | 46.07 | 0.28 |
| $H_2O$ | 647.3 | 12.8 | 65.0 | 18.02 | 0.33 |
| $C_2F_6$ | 292.8 | 30.4 | 22.4 | 138.01 | 0.61 |

To describe conditions for different supercritical solvents, the terms "reduced temperature," "reduced pressure," and "reduced density" are used. Reduced temperature, with respect to a particular solvent, is temperature (measured in Kelvin) divided by the critical temperature (measured in Kelvin) of the particular solvent, with analogous definitions for pressure and density. For example, at 333K and 150 atm, the density of $CO_2$ is 0.60 g/cm$^3$; therefore, with respect to $CO_2$, the reduced temperature is 1.09, the reduced pressure is 2.06, and the reduced density is 1.28. Many of the properties of supercritical solvents are also exhibited by near-supercritical solvents, which refers to solvents having a reduced temperature and a reduced pressure both greater than 0.8, but not both greater than 1 (in which case the solvent would be supercritical). One set of suitable conditions for CFD include a reduced temperature of the supercritical or near-supercritical solvent of between 0.8 and 1.6 and a critical temperature of the fluid of less than 150° C.

Carbon dioxide ($CO_2$) is a particularly good choice of solvent for CFD. Its critical temperature (31.1° C.) is close to ambient temperature and thus allows the use of moderate process temperatures (<80° C.). It is also unreactive with most precursors used in CVD and is an ideal media for running reactions between gases and soluble liquids or solid substrates. Other suitable solvents include, for example, ethane or propane, which may be more suitable than $CO_2$ in certain situations, e.g., when using precursors which can react with $CO_2$, such as complexes of low-valent metals containing strong electron-donating ligands (e.g., phospines).

Precursors and Reaction Mechanisms

Precursors are chosen so that they yield the desired material on the substrate surface following reaction with the reaction reagent. Materials can include metals (e.g., Cu, Pt, Pd, and Ti), elemental semiconductors (e.g., Si, Ge, and C), compound semiconductors (e.g., III–V semiconductors such as GaAs and InP, II–VI semiconductors such as CdS, and IV–VI semiconductors such as PbS), oxides (e.g., $SiO_2$ and $TiO_2$), or mixed metal or mixed metal oxides (e.g., a superconducting mixture such as Y—Ba—Cu—O). Organometallic compounds and metallo-organic complexes are an important source of metal-containing reagents and are particularly useful as precursors for CFD. In contrast, most inorganic metal-containing salts are ionic and relatively insoluble, even in supercritical fluids that include polar modifiers such as methanol.

Some examples of useful precursors for CFD include metallo-organic complexes containing the following classes of ligands: beta-diketonates (e.g., $Cu(hfac)_2$ or $Pd(hfac)_2$, where hfac is an abbreviation for 1,1,1,5,5,5-hexafluoroacetylacetonate), alkyls (e.g., $Zn(ethyl)_2$ or dimethylcyclooctadiene platinum ($CODPtMe_2$)), allyls (e.g. bis (allyl)zinc or $W(\pi^4\text{-allyl})_4$), dienes (e.g., $CODPtMe_2$), or metallocenes (e.g., $Ti(\pi^5—C_5H_5)_2$ or $Ni(\pi^5—C_5H_5)_2$). For a list of additional potential precursors see for example, M. J. Hampden-Smith and T. T. Kodas, *Chem. Vap. Deposition*, 1:8 (1995).

Precursor selection for CVD is limited to stable organometallic compounds that exhibit high vapor pressure at temperatures below their thermal decomposition temperature. This limits the number of potential precursors. CFD obviates the requirement of precursor volatility and replaces it with a much less demanding requirement of precursor solubility in a supercritical fluid.

Any reaction yielding the desired material from the precursor can be used in CFD. However, low process temperatures (e.g., less than 250° C., 200° C., 150° C., or 100° C.) and relatively high fluid densities (e.g., greater than 0.2 $g/cm^3$) in the vicinity of the substrate are important features of CFD. If the substrate temperature is too high, the density of the fluid in the vicinity of the substrate approaches the density of a gas, and the benefits of the solution-based process are lost. In addition, a high substrate temperature can promote deleterious fragmentation and other side-reactions that lead to film contamination. Therefore a reaction reagent, rather than thermal activation, is used in CFD to initiate the reaction that yields the desired material from the precursor.

For example, the reaction can involve reduction of the precursor (e.g., by using $H_2$ or $H_2S$ as a reducing agent), oxidation of the precursor (e.g., by using $O_2$ or $N_2O$ as an oxidizing agent), or hydrolysis of the precursor (i.e., adding $H_2O$). An example of an oxidation reaction in CFD is the use of $O_2$ (the reaction reagent) to oxidize a zirconium beta-diketonate (the precursor) to produce a metal thin film of $ZrO_2$. An example of a hydrolysis reaction in CFD is water (the reaction reagent) reacting with a metal alkoxide (the precursor), such as titanium tetraisopropoxide (TTIP), to produce a metal oxide thin film, such as $TiO_2$. The reaction can also be initiated by optical radiation (e.g., photolysis by ultraviolet light). In this case, photons from the optical radiation are the reaction reagent.

Chemical selectivity at the substrate can be enhanced by a temperature gradient established between the substrate and the supercritical solution. For example, a gradient of 40° C. to 250° C. or 80° C. to 150° C. can be beneficial. However, to maintain the benefits of CFD, the temperature of the substrate measured in Kelvin divided by the average temperature of the supercritical solution measured in Kelvin is typically between 0.8 and 1.7.

In some cases, the supercritical fluid can participate in the reaction. For example, in a supercritical solution including $N_2O$ as a solvent and metal precursors such as organometallic compounds, $N_2O$ can serve as an oxidizing agent for the metal precursors yielding metal oxides as the desired material. In most cases, however, the solvent in the supercritical fluid is chemically inert.

EXAMPLES

1) Platinum film on a silicon wafer

A platinum metal film was deposited onto a silicon wafer by reduction of dimethylcyclooctadiene platinum(II) ($CODPtMe_2$) with hydrogen gas in a supercritical $CO_2$ solution. Polished silicon test wafers (orientation: <100>, Boron doped type P, 450 microns thick), carbon dioxide (99.99%), and hydrogen gas (pre-purified grade) were commercially obtained and used without modification. $CODPtMe_2$ is useful because of its high platinum content (58.5 wt. %), low toxicity of the ligands, and heptane solubility, which is a good indicator of solubility in $CO_2$. Prior to CFD, solubility measurements of $CODPtMe_2$ in $CO_2$ were preformed in a view cell. Results indicated that the solubility of the precursor was greater than 1% by weight at 40° C. and 100 bar and that no degradation of precursor was observed over a range of temperatures up to 80° C.

$CODPtMe_2$ was dissolved into supercritical $CO_2$ at 80° C. and 155 bar to produce a 0.6% by weight precursor solution. The reaction vessel containing the precursor solution and silicon wafer was allowed to equilibrate for 2 hours. The precursor was then reduced by the addition of approximately 15× molar excess of $H_2$ gas. Reduction resulted in the deposition of continuous, reflective Pt films on the silicon wafers. Scanning electron microscopy (SEM) analysis of the film revealed well defined 80–100 nm platinum crystals. The platinum film was approximately 1.3 microns thick and uniform as determined by SEM analysis of fracture cross-sections of the composite.

X-ray photoelectron spectroscopy (XPS) indicated that the film was free of ligand-derived contamination. XPS was performed using a spectrometer employing Mg Kα_excitation (400 W 15.0 kV). FIG. 1 shows an XPS survey spectrum taken after sputter cleaning with $Ar^+$ ions to remove atmospheric contaminates. The spectrum gives the normalized number of electrons (in arbitrary units) ejected from a site in the film as a function of the binding energy of that site. The small C1S carbon peak (284 eV) observed in the spectrum of the sputtered deposit is at the detection limit of the instrument and could not be meaningfully quantified by multiplex analysis. The continuity of the film was confirmed by the absence of $Si_{2s}$ peaks at 153 eV ($Si_{2p}$ peaks at 102 and 103 eV would be obscured by the $Pt_{5s}$ photoelectron line). Pt photoelectron lines are observed at the following energies: $4f_{7/2}$=73 eV, $4f_{5/2}$=76 eV, $4d_5$=316 eV, $4d_3$=333 eV, $4p_3$=521 eV, $4p_1$=610 eV, and 4s=726 eV. For a reference on XPS see Christmann, K., *Introduction to Surface Physical Chemistry*; Springer-Verlag: New York (1991), chapter 4.

2) Platinum film on a fluoropolymer substrate

Platinum metal was deposited on a 0.95 gram sample of 0.9 mm thick sheet of polytetrafluoroethylene (PTFE) by reduction of $CODPtMe_2$ with $H_2$ gas, as generally described in Example 1. A 1.2% by weight solution of $CODPtMe_2$ in $CO_2$ was equilibrated with the PTFE sample at 80° C. and 155 bar for 4 hours. The precursor was then reduced by the addition of a 15× molar excess of $H_2$ gas. Following deposition, the sample exhibited a bright reflective coating. An SEM image of the surface of the sample indicated the presence of relatively large platinum crystals. Platinum clusters were also observed in the bulk of the sample by transmission electron microscopy (TEM) analysis of interior sections of the sample obtained by cryogenic microtomy.

3) Platinum deposited within porous aluminum oxide

Anopore™ aluminum oxide ($Al_2O_3$) membranes having 200 nm straight pores were obtained from Whatman International Ltd. (Maidstone, England) and used as a porous solid substrate. The pores are oriented perpendicular to the surface, are approximately hexagonally packed, and exhibit a narrow pore size distribution.

An 11.3 mg sample of an $Al_2O_3$ membrane was exposed to a 0.74 wt. % solution of $CODPtMe_2$ in $CO_2$ at 80° C. and 155 bar for two hours in a small (ca. 3 ml) reaction vessel. $CODPtMe_2$ was then reduced by the addition of $H_2$ gas, resulting in the deposition of platinum, as was done in Examples 1 and 2. After deposition, the surface of the membrane was metallic-gray in color. A sample of the metallized membrane was cast in epoxy and cross-sectioned by cryomicrotomy. TEM analysis of the sections indicated the presence of small Pt clusters distributed throughout the pores. Pt deposition within a second membrane at similar conditions (0.68 wt. % $CODPtMe_2$, 80° C., 155 bar, 2 hours, followed by reduction with $H_2$) yielded similar results. Analysis of the second membrane by SEM revealed small Pt clusters distributed throughout the pores.

4) Palladium film on a silicon wafer

Palladium metal films were deposited by the hydrogenolysis of palladium (II) hexafluoroacetylacetonate (Pd$(hfac)_2$) in supercritical $CO_2$. Solubility of Pd$(hfac)_2$ in $CO_2$ was predicted based on the presence of the fluorinated ligands and confirmed by experiments in a view cell. With the exception of the precursor, Pd$(hfac)_2$, the procedure was similar to the one used in Example 1. A Si wafer in contact with a 0.62% by weight solution of Pd$(hfac)_2$ in $CO_2$ was equilibrated at 80° C. and 155 bar for 2 hours. The precursor was then reduced by the addition of a 15× molar excess of $H_2$ gas. The process produced a bright and reflective Pd film.

Figure 2:
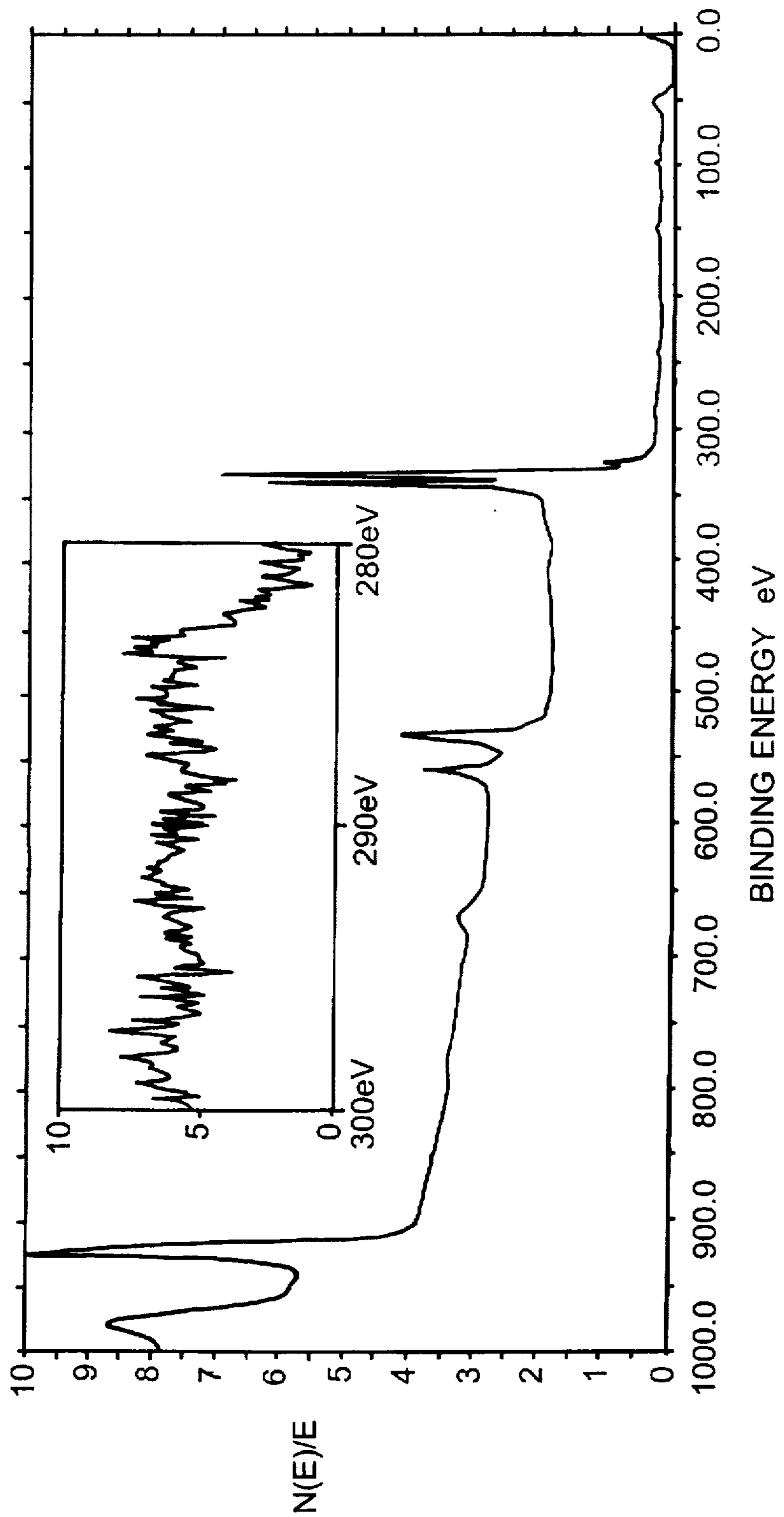
FIG. 2 is an XPS survey spectra (75° take-off angle) of a palladium film deposited on a silicon wafer using CFD. Results are shown after sputter cleaning with $Ar^+$ ions to remove atmospheric contamination. The inset is an expansion of the $C_{1s}$ region of the spectra.

FIG. 2 shows an XPS survey spectrum taken after sputter cleaning with $Ar^+$ ions to remove atmospheric contaminates. There were no peaks detected in the $C_{1s}$ carbon region (280–290 eV) of the sputtered deposit. The inset in FIG. 2 is an expansion the XPS spectra in the 280 eV to 300 eV region, which contains the $C_{1s}$ region. Fluorine photoelectron lines ($F1_s$=686 eV) were not observed indicating no contamination by the ligand or ligand-derived decomposition products. Pd photoelectron lines are observed at the following binding energies (Mg source): $4p_3$=54 eV, 4s =88 eV, $3d_5$=337 eV, $3d_3$=342 eV, $3p_3$=534 eV, $3p_1$=561 eV, and 4s =673 eV. Auger lines are observed at 928 eV and 979 eV. Additional experiments at similar conditions (e.g., 0.59 wt % Pd$(hfac)_2$, 80° C., 156 bar, 2 hours) yielded similar results.

5) Palladium thin film from supercritical ethane

A palladium thin film is deposited onto a silicon wafer by reduction of palladium(II) bis(2,2,7-trimethyl-3,5-octanedionate) (Pd$(tod)_2$) with $H_2$ in supercritical ethane solvent. With the exception of the precursor, Pd$(tod)_2$, and the solvent, ethane, the procedure is similar to the one in Example 1. Temperature is set between 32° C. and 100° C., pressure is set between 75 and 500 bar, and the supercritical Pd$(tod)_2$ solution concentration is set between 0.01% and 1.0% by weight.

6) Copper thin film on a silicon wafer

A copper thin film is deposited onto a silicon wafer, by reduction of copper(II) bis(hexafluoroacetyl-acetone) (Cu$(hfac)_2$) with $H_2$ in supercritical $CO_2$ solvent. With the exception of the precursor, (Cu$(hfac)_2$), the procedure is similar to the one in Example 1. Temperature is set between 32° C. and 100° C., pressure is set between 75 and 500 bar, and the supercritical Cu$(hfac)_2$ solution concentration is set between 0.01% and 1.0% by weight.

7) Metal sulfide thin film on a silicon wafer

A metal sulfide (e.g., CdS, PbS, and ZnS) film is deposited onto a silicon wafer by the reaction of the reaction reagent $H_2S$ with a suitable alkyl, allyl, or beta-ketonate metal complex, for example reduction of bis(allyl)zinc with $H_2S$ to yield ZnS. The procedure is similar to the one performed in Example 1 with the exception of the precursor, bis(allyl) zinc, and the reaction reagent, $H_2S$. Temperature is set between 32° C. and 100° C., pressure is set between 75 and 500 bar, and the supercritical bis(allyl)zinc solution concentration is set between 0.01 and 1.0 percent by weight.

8. Mixed metal thin film of Y—Ba—Cu

A mixed metal film of Y—Ba—Cu is deposited onto a silicon wafer by dissolving metal beta-diketonates of Y, Ba, and Cu, such as $Y(thd)_3$, $Ba(thd)_3$, and $Cu(thd)_3$, into supercritical ethane to form a solution with a stoichiometric ratio of 1Y:2Ba:3Cu. $H_2$ gas is used as a reducing agent to decompose the precursors into elemental metal on the substrate surface. The procedure is similar to the one performed in Example 1 with the exception of different precursors (i.e., metal beta-diketonates) and a different supercritical solvent (i.e., ethane). Temperature is set between 32° C. and 100° C., pressure is set between 75 and 500 bar, and the supercritical solution concentration for each of the different metals is set between 0.01 and 1.0 percent by weight.

Subsequent to forming the mixed metal film by CFD, the mixed metal film can be oxidized using standard techniques, for example by an oxygen plasma, to give a superconducting thin film of $YBa_2Cu_3O_{7-x}$, (e.g., see Sievers et al U.S. Pat. No. 4,970,093).

Other Embodiments

It is to be understood that while the invention has been described in conjunction with the detailed description thereof, the foregoing description is intended to illustrate and not limit the scope of the invention, which is defined by the scope of the appended claims.

Other aspects, advantages, and modifications are within the scope of the following claims.

What is claimed is:

1. A method for depositing a film of a material onto a surface of a substrate, said method comprising:
   - i) dissolving a precursor of the material into a solvent to form a supercritical or near-supercritical solution;
   - ii) exposing the substrate to said solution under conditions at which the precursor is stable in the solution; and
   - iii) mixing a reaction reagent into said solution under conditions that initiate a chemical reaction involving the precursor, wherein the material is deposited onto the surface of the substrate when both the substrate and the reaction reagent are in contact with said solution, while maintaining supercritical or near-supercritical conditions.

2. A method of claim 1, wherein the temperature of the substrate is maintained at no more than 200° C.

3. A method of claim 1, wherein said solvent has a reduced temperature between 0.8 and 1.6 during each of the dissolving, exposing, and mixing steps.

4. A method of claim 1, wherein said solvent has a density of at least 0.2 g/cm$^3$ during each of the dissolving, exposing, and mixing steps.

5. A method of claim 1, wherein said solvent has a density of at least one third of its critical density during each of the dissolving, exposing, and mixing steps.

6. A method of claim 1, wherein said solvent has a critical temperature of less than 150° C.

7. A method of claim 1, wherein the temperature of the substrate measured in Kelvin is less than twice the critical temperature of said solvent measured in Kelvin while the material is being deposited onto the surface of the substrate.

8. A method of claim 1, wherein the temperature of the substrate measured in Kelvin divided by the average temperature of the supercritical solution measured in Kelvin is between 0.8 and 1.7 while the material is being deposited onto the surface of the substrate.

9. A method of claim 1, wherein the chemical reaction is a reduction reaction.

10. A method of claim 9, wherein the reaction reagent is hydrogen.

11. A method of claim 1, wherein the chemical reaction is an oxidation or hydrolysis reaction.

12. A method of claim 1, wherein the material comprises a metal.

13. A method of claim 1, wherein the material comprises a semiconductor.

14. A method of claim 1, wherein the material comprises an insulator.

15. A method of claim 1, wherein the material comprises a mixture of metals.

16. A method of claim 1, wherein the material comprises a metal oxide or a metal sulfide.

17. A method of claim 1, wherein the substrate comprises silicon or a fluoropolymer.

18. A method of claim 1, wherein said solvent comprises carbon dioxide.

19. A method of claim 1, wherein the average temperature of the supercritical solution is different from the temperature of the substrate while the material is being deposited onto the surface of the substrate.

20. A method for depositing material within a microporous or nanoporous solid substrate, said method comprising:

i) dissolving a precursor of the material into a solvent to form a supercritical or near-supercritical solution;

ii) exposing the solid substrate to said solution under conditions at which the precursor is stable in the solution; and iii) mixing a reaction reagent into said solution under conditions that initiate a chemical reaction involving the precursor, wherein the material is deposited within the solid substrate when both the solid substrate and the reaction reagent are in contact with said solution, while maintaining supercritical or near-supercritical conditions.

21. A method of claim 20, wherein the temperature of the solid substrate is maintained at no more than 200° C.

* * * * *